United States Patent
Park et al.

(10) Patent No.: US 10,365,307 B2
(45) Date of Patent: Jul. 30, 2019

(54) APPARATUS AND METHOD FOR SENSING OPENING OF CURRENT INTERRUPT DEVICE OF BATTERY UNIT

(71) Applicant: LG CHEM, LTD., Seoul (KR)

(72) Inventors: Mi So Park, Daejeon (KR); Jongmin Park, Daejeon (KR); Hyunchul Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 284 days.

(21) Appl. No.: 15/519,975

(22) PCT Filed: Jan. 28, 2016

(86) PCT No.: PCT/KR2016/000962
§ 371 (c)(1),
(2) Date: Apr. 18, 2017

(87) PCT Pub. No.: WO2016/122239
PCT Pub. Date: Aug. 4, 2016

(65) Prior Publication Data
US 2017/0328936 A1   Nov. 16, 2017

(30) Foreign Application Priority Data
Jan. 28, 2015 (KR) .................. 10-2015-0013434

(51) Int. Cl.
*H02J 7/00* (2006.01)
*H01M 10/48* (2006.01)
(Continued)

(52) U.S. Cl.
CPC ... *G01R 19/16542* (2013.01); *G01R 31/2827* (2013.01); *G01R 31/36* (2013.01);
(Continued)

(58) Field of Classification Search
CPC ............ H02J 2007/0037; H02J 7/0026; H02J 7/0031; H02J 50/10; H02J 50/12;
(Continued)

(56) References Cited

U.S. PATENT DOCUMENTS 8,228,037 B2   7/2012 Furukawa et al.
8,629,687 B2   1/2014 Ishikawa et al.
(Continued)

FOREIGN PATENT DOCUMENTS

JP   2010-130768 A   6/2010
JP   2011-135657 A   7/2011
(Continued)

OTHER PUBLICATIONS

Extended European Search Report, dated Sep. 13, 2018, for European Application No. 16743717.7.
(Continued)

*Primary Examiner* — Drew A Dunn
*Assistant Examiner* — Sailesh Thapa
(74) *Attorney, Agent, or Firm* — Birch, Stewart, Kolasch & Birch, LLP (57) ABSTRACT

Disclosed are an apparatus and a method for sensing opening of a current interrupt device (CID) of a battery unit. An apparatus for sensing opening of a current interrupt device of a battery unit according to the present invention is configured to include: a setting unit setting a predetermined voltage section when discharge of one or more battery units starts; a measuring unit measuring a voltage section pass time which is the time when the one or more battery units pass through the predetermined voltage section for each battery unit; and a detecting unit detecting a battery unit in which the current interrupt device (CID) is opened among the one or more battery units and detecting the number of battery cells in which the CID is opened among one or more
(Continued)

battery cells included in the battery unit in which the CID is opened based on the voltage section pass time for each battery unit.

12 Claims, 5 Drawing Sheets (51) Int. Cl.
G01R 19/165 (2006.01)
G01R 31/3842 (2019.01)
G01R 31/36 (2019.01)
G01R 31/28 (2006.01)
H02H 3/04 (2006.01)
G01R 31/3835 (2019.01)
G01R 31/02 (2006.01)

(52) U.S. Cl.
CPC ..... *G01R 31/3835* (2019.01); *G01R 31/3842* (2019.01); *H01M 10/482* (2013.01); *H02H 3/04* (2013.01); *H02J 7/00* (2013.01); *H02J 7/0026* (2013.01); *G01R 31/026* (2013.01)

(58) Field of Classification Search
CPC .. H02J 50/40; H02J 50/50; H02J 50/80; H02J 7/0016; H02J 7/0022; H02J 7/0029; H02J 7/0044; H02J 7/0047; H02J 7/0077; H02J 7/025; H01M 10/0525; H01M 10/482; H01M 2220/20; H01M 10/0431; H01M 10/4257; H01M 2010/4271; H01M 2/0217; H01M 2/022; H01M 2/1077
See application file for complete search history.

(56) References Cited

U.S. PATENT DOCUMENTS

| 9,529,050 | B2 | 12/2016 | Kawahira et al. |
| 2010/0127663 | A1* | 5/2010 | Furukawa ............ B60L 3/0046 320/134 |
| 2011/0148361 | A1* | 6/2011 | Yokotani ............. H01M 10/482 320/136 |
| 2013/0342212 | A1* | 12/2013 | Kawahira .......... G01R 31/3835 324/433 |
| 2015/0236525 | A1* | 8/2015 | Aridome ............ G01R 31/3835 320/107 |

FOREIGN PATENT DOCUMENTS

| JP | 2012-44844 A | 3/2012 |
| JP | 2014-6189 A | 1/2014 |
| JP | 2014-236652 A | 12/2014 |
| KR | 10-2014-0073627 A | 6/2014 |
| WO | WO 2013/176087 A1 | 11/2013 |

OTHER PUBLICATIONS

International Search Report for PCT/KR2016/000962 (PCT/ISA/210) dated Apr. 28, 2016.

* cited by examiner

APPARATUS AND METHOD FOR SENSING OPENING OF CURRENT INTERRUPT DEVICE OF BATTERY UNIT

TECHNICAL FIELD

This application claims priority to and the benefit of Korean Patent Application No. 10-2015-0013434 filed in the Korean Intellectual Property Office on Jan. 28, 2015, the entire contents of which are incorporated herein by reference.

The present invention relates to an apparatus and a method for sensing opening of a current interrupt device (CID) of a battery unit, and particularly, to an apparatus and a method for sensing opening of a current interrupt device (CID) of a battery unit, which accurately detect a battery unit in which a current interrupt device is opened among one or more battery units and the number of one or more battery cells included in the battery unit in which the current interrupt device is opened by setting a predetermined voltage section, and set a reference battery unit and add voltage difference values between the reference battery unit and one or more respective battery units to each battery unit voltage value to prevent an opening sensing error of the current interrupt device due to a voltage imbalance between the respective battery units.

Further, the present invention also relates to an apparatus and a method for sensing opening of a current interrupt device of a battery unit, which announces a warning message indicating that a current interrupt device is opened to a user when the number of battery cells in which the current interrupt device is opened is more than a predetermined ratio to reduce a risk of ignition.

BACKGROUND ART

A secondary battery is universally applied to an electric vehicle (EV) driven by an electric driving source, a hybrid vehicle (HV) or an energy storage system (ESS) or an uninterruptible power supply (UPS) system using a medium/large battery used for a house or an industry as well as a portable device.

When the secondary battery is implemented as a battery of a portable terminal, or the like, it may not particularly be applied as above, but in the case of the battery applied to the electric vehicle or an energy storage source, unit secondary battery cells are generally aggregated and used to increase suitability for a high-capacity environment.

The secondary battery stores and further, discharges energy while charging/discharging and further, overcharging of the secondary battery may generally cause a danger in safety due to a characteristic that the energy is accumulated. When an in-cell overcharge phenomenon of the secondary battery occurs, an air pore of a separator positioned between cathode and anode materials with an increase of temperature in the cell is closed, and as a result, a phenomenon in which the battery cell is swelled may occur and an explosion phenomenon may occur.

Therefore, a safety circuit against the overcharge is particularly provided in a battery device, and as a result, a device is required, which prevents further charging before the battery is ignited and exploded while charging and a device that interrupts current which flows on the cell of the secondary battery is referred to as a current interrupt device (CID).

Meanwhile, since overdischarge of the battery reduces life-span durability of the battery due to a characteristic in which the energy is consumed, the current interrupt device operates when not only the battery is overcharged but also the battery is overdischarged and when a battery user uses the battery while not recognizing that the current interrupt device is opened while discharging the battery, more excessive current than the battery cells included in another battery unit may flow in the battery cells included in the battery unit in which the current interrupt device is opened, and as a result, there is a risk of the ignition.

Therefore, an apparatus that can sense whether the current interrupt device is opened during discharging of the battery is required for the battery together with the current interrupt device, but in the related art, the apparatus that that senses whether the current interrupt device of the battery cell is opened does not exist during the discharging of the battery and the battery user may not know whether the current interrupt device is opened, and as a result, the battery user is exposed to the risk of the ignition.

In the present invention, when the battery is discharged, a situation in which the current interrupt device is opened is immediately announced to the user to allow the user to take an action against the corresponding situation in advance, thereby preventing a safety situation such as the ignition.

DETAILED DESCRIPTION OF THE INVENTION

Technical Problem

An object of the present invention is to provide an apparatus and a method for sensing opening of a current interrupt device (CID) of a battery unit, which accurately detect a battery unit in which a current interrupt device is opened among one or more battery units and the number of one or more battery cells included in the battery unit in which the current interrupt device is opened by setting a predetermined voltage section, and set a reference battery unit and add voltage difference values between the reference battery unit and one or more respective battery units to each battery unit voltage value to prevent an opening sensing error of the current interrupt device due to a voltage imbalance between the respective battery units.

Another object of the present invention is to provide an apparatus and a method for sensing opening of a current interrupt device of a battery unit, which announce a warning message indicating that a current interrupt device is opened to a user when the number of battery cells in which the current interrupt device is opened is more than a predetermined ratio to reduce a risk of ignition.

Technical Solution

An apparatus for sensing opening of a current interrupt device of a battery unit according to an embodiment of the present invention is configured to include: a setting unit setting a predetermined voltage section when discharge of one or more battery units starts; a measuring unit measuring a voltage section pass time which is the time when the one or more battery units pass through the predetermined voltage section for each battery unit; and a detecting unit detecting a battery unit in which the current interrupt device (CID) is opened among the one or more battery units based on the voltage section pass time for each battery unit and detecting the number of battery cells in which the CID is opened among one or more battery cells included in the battery unit in which the CID is opened.

The setting unit may set any one of the one or more battery units which are discharged as a reference battery unit when discharge of the one or more battery units starts and set the predetermined voltage section based on a voltage value of the reference battery unit when a predetermined time elapses after the discharge starts.

The apparatus for sensing opening of a current interrupt device of a battery unit may further include a correcting unit calculating a voltage difference between the voltage of the reference battery unit when the predetermined time elapses and the voltage of each of the one or more battery units and adding the voltage difference value to the voltage value of each of the one or more battery units.

The detecting unit may find a maximum value among the voltage values of the one or more respective battery units and compare the maximum value and a lowerlimit value of the predetermined voltage section.

The detecting unit may calculate a normalized count which is a percentage of the voltage section pass time of the battery unit to an average of the voltage section pass time of all of one or more battery units for each battery unit when the maximum value is smaller than the lowerlimit value.

The detecting unit may compare the normalized coefficient and a predetermined reference value with each other to detect the battery unit in which the CID is opened among the one or more battery units and the number of battery cells in which the CID is opened among one or more battery cells included in the battery unit in which the CID is opened.

The apparatus for sensing opening of a current interrupt device of a battery unit may further include a display unit displaying a warning message indicating that the CID is opened when a ratio of the number of battery cells in which the CID is opened among one or more battery cells included in the battery unit in which the CID is opened is equal to or more than a predetermined value.

A method for sensing opening of a current interrupt device of a battery unit according to an embodiment of the present invention is configured to include: setting a predetermined voltage section when discharge of one or more battery units starts; measuring a voltage section pass time which is the time when the one or more battery units pass through the predetermined voltage section for each battery unit; and detecting a battery unit in which the current interrupt device (CID) is opened among the one or more battery units based on the voltage section pass time for each battery unit and detecting the number of battery cells in which the CID is opened among one or more battery cells included in the battery unit in which the CID is opened.

The setting may include setting any one of the one or more battery units which are discharged as a reference battery unit when discharge of the one or more battery units starts and setting the predetermined voltage section based on a voltage value of the reference battery unit when a predetermined time elapses after the discharge starts.

The method for sensing opening of a current interrupt device of a battery unit may further include calculating a difference between the voltage of the reference battery unit when the predetermined time elapses and the voltage of each of the one or more battery units and adding the voltage difference value to the voltage value of each of the one or more battery units.

The detecting may include finding a maximum value among the voltage values of the one or more respective battery units and comparing the maximum value and a lowerlimit value of the predetermined voltage section.

The detecting may further include calculating a normalized count which is a percentage of the voltage section pass time of the battery unit to an average of the voltage section pass time of all of one or more battery units for each battery unit when the maximum value is smaller than the lowerlimit value.

The detecting may further include comparing the normalized coefficient and a predetermined reference value with each other to detect the battery unit in which the CID is opened among the one or more battery units and the number of battery cells in which the CID is opened among one or more battery cells included in the battery unit in which the CID is opened.

The method for sensing opening of a current interrupt device of a battery unit may further include displaying a warning message indicating that the CID is opened when a ratio of the number of battery cells in which the CID is opened among one or more battery cells included in the battery unit in which the CID is opened is equal to or more than a predetermined value.

Advantageous Effects

According to an aspect of the present invention, it is possible to provide an apparatus and a method for sensing opening of a current interrupt device (CID) of a battery unit, which accurately detect a battery unit in which a current interrupt device is opened among one or more battery units and the number of one or more battery cells included in the battery unit in which the current interrupt device is opened by setting a predetermined voltage section, and set a reference batter unit and add voltage difference values between the reference battery unit and one or more respective battery units to each battery unit voltage value to prevent an opening sensing error of the current interrupt device due to a voltage imbalance between the respective battery units.

Further, it is possible to provide an apparatus and a method for sensing opening of a current interrupt device of a battery unit, which announce a warning message indicating that a current interrupt device is opened to a user when the number of battery cells in which the current interrupt device is opened is more than a predetermined ratio to reduce a risk of ignition.

BEST MODE

An apparatus for sensing opening of a current interrupt device of a battery unit according to an embodiment of the present invention is configured to include: a setting unit setting a predetermined voltage section when discharge of one or more battery units starts; a measuring unit measuring a voltage section pass time which is the time when the one or more battery units pass through the predetermined voltage section for each battery unit; and a detecting unit detecting a battery unit in which the current interrupt device (CID) is opened among the one or more battery units and detecting the number of battery cells in which the CID is opened among one or more battery cells included in the battery unit in which the CID is opened based on the voltage section pass time for each battery unit.

MODE FOR INVENTION

The present invention will be described below in detail with reference to the accompanying drawings. Herein, a repeated description, and a detailed description of a known function and a known constitution which may unnecessarily obscure the spirit of the present invention will be skipped. The embodiment of the present invention is provided to more completely describe the present invention to those skilled in the art. Accordingly, the shape, the size, etc., of elements in the figures may be exaggerated for more explicit comprehension.

Throughout the specification, unless explicitly described to the contrary, the word "comprise" and variations such as "comprises" or "comprising", will be understood to imply the inclusion of stated elements but not the exclusion of any other elements.

In addition, the term "unit" disclosed in the specification means a unit that processes at least one function or operation and this may be implemented by hardware or software or a combination of hardware and software.

Figure 1:
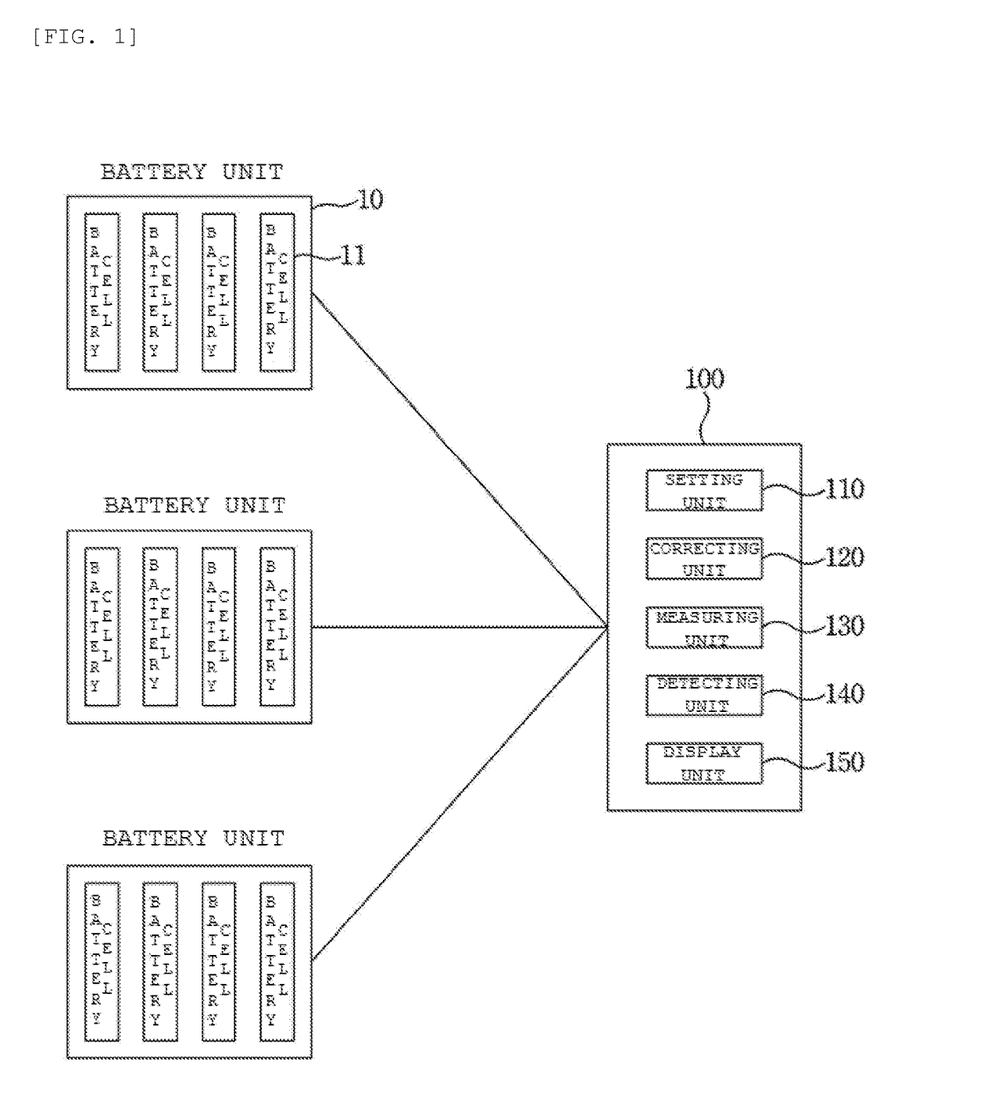
FIG. 1 is a diagram schematically illustrating an apparatus for sensing opening of a current interrupt device (CID) of a battery unit according to an embodiment of the present invention.

FIG. 1 is a diagram schematically illustrating an apparatus 100 for sensing opening of a current interrupt device (CID) of a battery unit according to an exemplary embodiment of the present invention.

Referring to FIG. 1, the apparatus 100 for sensing opening of a current interrupt device of a battery unit according to the embodiment of the present invention announces to a battery user whether a current interrupt device (not illustrated) connected with a battery cell 11 is opened. The apparatus 100 for sensing opening of a current interrupt device of a battery unit according to the embodiment of the present invention may be implemented by a setting unit 110, a correcting unit 120, a measuring unit 130, a detecting unit 140, and a display unit 150.

The apparatus 100 for sensing opening of a current interrupt device of a battery unit, which is illustrated in FIG. 1 follows the embodiment and components are not limited to the embodiment illustrated in FIG. 1 and some components may be added, changed, or deleted as necessary.

Herein, the type of battery unit 10 is not particularly limited and the battery unit 10 may be constituted by for example, a battery module, a battery pack, a battery rack, a battery bank, and the like.

The setting unit 110 may set a predetermined voltage section when discharge of one or more battery units 10 starts. The predetermined voltage section is set to accurately detect the number of battery cells 11 in which the current interrupt device is opened and a method for accurately detecting the number of battery cells 11 in which the current interrupt device is opened will be described below.

Further, the setting unit 110 may set nay any one of one or more battery units 10 which are discharged as a reference batter unit 10 when the discharge of one or more battery units 10 starts and set the predetermined voltage section based on a voltage value of the reference battery unit 10 when a predetermined time is reached after the discharge starts. In the case of the reference battery unit 10, any one of one or more battery units 10 which are discharged may be set as the reference battery unit 10 and as necessary, the battery user may designate the reference battery unit 10.

A process of setting the predetermined voltage section based on the voltage value of the reference battery unit 10 is determined through an experiment and an upperlimit value of the predetermined voltage section needs to be lower than an initial voltage value of the reference battery unit 10.

The correcting unit 120 may calculate a difference between the voltage of the reference battery unit 10 and the voltage of each of one or more battery units 10 when the predetermined time is reached and add the voltage difference value to the voltage value of each of one or more battery units 10. When the voltage difference value is added to the voltage value of each of one or more battery units 10, the corresponding value coincides with the voltage value of the reference battery unit 10 and this is referred to as voltage deviation correction between the battery units 10. When the voltage deviation between the battery units 10 is corrected, all of the voltage values at voltage drop points of time of the respective battery units 10 are equal to each other to accurately determine a voltage reduction amount per time for each battery unit 10.

The IR drop is also referred to as ohmic drop and when current meets resistance, the voltage drops and the IR drop represents that the voltage difference between a first part and an end part occurs when a wire is long. The predetermined time is set to correct voltage after the IR drop and in general, since the IR drop occurs before 2 seconds, the predetermined time may be set to 2 seconds.

Figure 2:
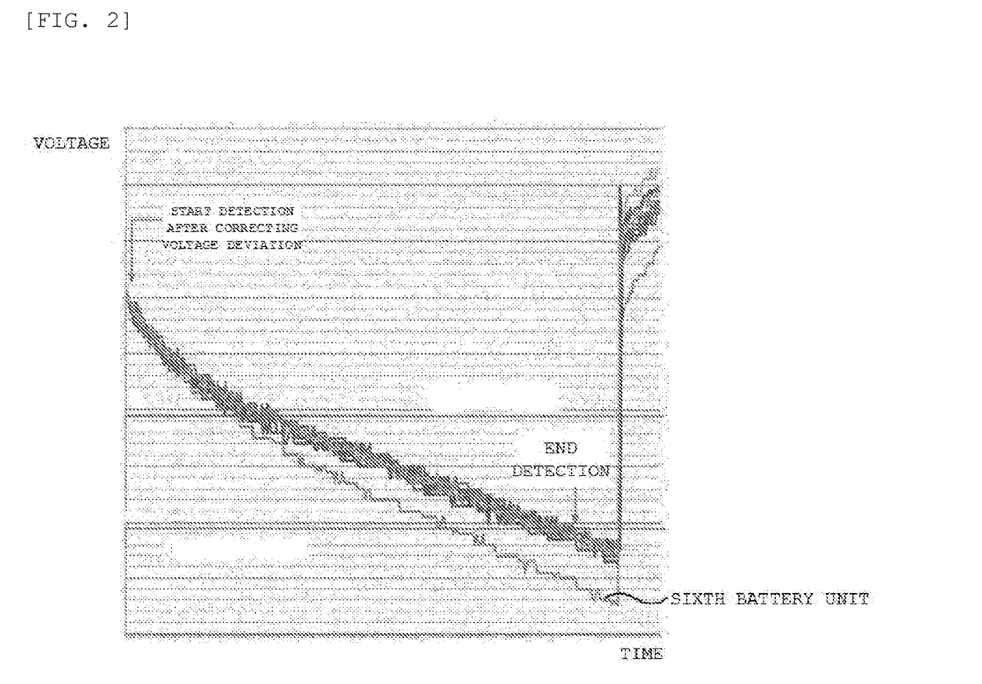
FIG. 2 is a diagram schematically illustrating a voltage change curve depending on a time of each battery unit in a state where IR drop occurs and a voltage deviation between battery units is not corrected.

FIG. 2 is a diagram schematically illustrating a voltage change curve depending on a time of each battery unit 10 in a state where IR drop occurs and a voltage deviation between battery units 10 is not corrected. In the state illustrated in FIG. 2, it is difficult to accurately detect a battery unit 10 in which the current interrupt device is opened among one or more battery units 10 and the number of battery cells 11 in which the current interrupt device is opened among one or more battery cells 11 included in the battery unit 10 in which the current interrupt device is opened due to the voltage deviation between the battery units 10.

Figure 3:
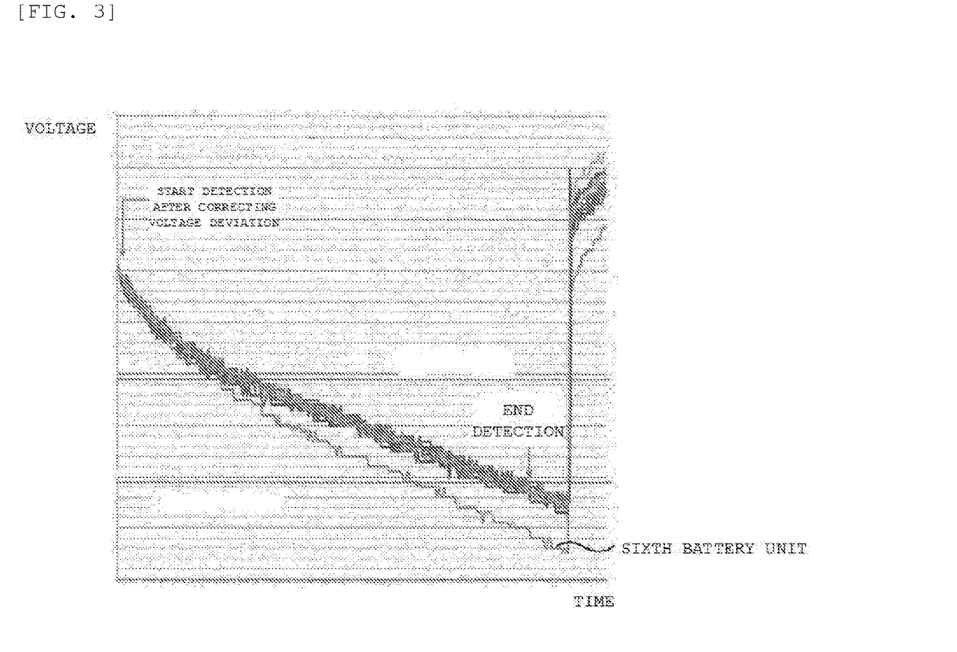
FIG. 3 is a diagram schematically illustrating a voltage change curve of each battery unit in which a voltage deviation between battery units is corrected after IR drop occurs depending on a time.

FIG. 3 is a diagram schematically illustrating a voltage change curve of each battery unit 10 in which a voltage deviation between battery units 10 is corrected after the IR drop depending on a time. The apparatus 100 for sensing opening of a current interrupt device of a battery unit according to the embodiment of the present invention corrects the voltage deviation through the correcting unit 120 as illustrated in FIG. 3, and as a result, all of the voltage values at the voltage drop points of time of the respective batter units 10 are equal to each other to accurately compare a voltage reduction amount per time and acquire the battery unit 10 in which the current interrupt device is opened and the number of the battery cells 11 based on the compared voltage reduction amounts.

The measuring unit 130 measures a voltage section pass time which is the time when one or more battery units 10 pass through the predetermined voltage section for each battery unit 10. The voltage section pass time of each battery unit 10 is a value for acquiring a normalized coefficient and the normalized coefficient will be described below.

The detecting unit 140 may detect the battery unit 10 in which the interrupt in which the current interrupt device is opened among one or more battery units 10 based on the voltage section pass time for each battery unit 10 and detect the number of battery cells 11 in which the current interrupt device is opened among one or more battery cells 11 included in the battery unit 10 in which the current interrupt device is opened.

Further, the detecting unit 140 may find a maximum value among the voltage values of one or more respective battery units 10 and compare the maximum value and a lowerlimit value of the predetermined voltage section. In the case where the maximum value among the voltage values of the respective battery units 10 is smaller than the lowerlimit value of the predetermined voltage section, the case may mean that the corresponding battery unit 10 passes through the voltage section, and as a result, measurement of the voltage section pass time for each corresponding battery unit 10 ends.

When the detecting unit 140 may calculate a normalized count which is a percentage of the voltage section pass time of the battery unit 10 to an average of the voltage section pass time of all of one or more battery units 10 for each battery unit 10 when the maximum value is smaller than the lowerlimit value. The normalized coefficient may be calculated by using Equation 1 given below.

$$X = \frac{A}{B} \times 100 \quad \langle \text{Equation 1} \rangle$$

Where, X represents the normalized coefficient, A represents the voltage section pass time of each battery unit, which is measured by the measuring unit, and B represents the average of the voltage section pass time of all battery units.

In the embodiment, the detecting unit 140 compares the normalized coefficient and a predetermined reference value to detect the battery unit 10 in which the current interrupt device is opened among one or more battery units 10 and the number of battery cells 11 in which the current interrupt device is opened among one or more battery cells 11 included in the battery unit 10 in which the current interrupt device is opened. The predetermined reference value may be a value acquired by dividing the voltage section pass time by the number of cells based on 100. Hereinafter, one example in which the detecting unit 140 detects the battery unit 10 in which the current interrupt device is opened and the number of battery cells 11 in which the current interrupt device is opened will be described with reference to Tables 1 and 2.

A more detailed predetermined reference value and the number of battery cells 11 in which the current interrupt device is opened, which corresponds thereto are disclosed in Table 1 given below. The detecting unit 140 may determine the number of battery cells in which the current interrupt device is opened based on the predetermined reference value of Table 1 including the normalized coefficient of Table 2. For example, since the normalized count of the sixth battery unit 10 is 77 in Table 2, the detecting unit 140 may detect 5 which is the number of battery cells 11 in which the current interrupt device is opened when the predetermined reference value is 77 or more and less than 81.

TABLE 1

| Predetermined reference value | The number of battery cells in which current interrupt device is opened |
|---|---|
| 96 or more | 0 |
| 92 or more and less than 96 | 1 |
| 88 or more and less than 92 | 2 |
| 85 or more and less than 88 | 3 |
| 81 or more and less than 85 | 4 |
| 77 or more and less than 81 | 5 |
| 74 or more and less than 77 | 6 |
| 70 or more and less than 74 | 7 |
| 66 or more and less than 70 | 8 |
| 62 or more and less than 66 | 9 |
| 59 or more and less than 62 | 10 |
| 55 or more and less than 59 | 11 |
| 51 or more and less than 55 | 12 |
| 48 or more and less than 51 | 13 |
| 44 or more and less than 48 | 14 |
| 40 or more and less than 44 | 15 |
| 37 or more and less than 40 | 16 |
| 33 or more and less than 37 | 17 |
| 29 or more and less than 33 | 18 |
| 25 or more and less than 29 | 19 |
| 22 or more and less than 25 | 20 |
| 18 or more and less than 22 | 21 |
| 14 or more and less than 18 | 22 |
| 11 or more and less than 14 | 23 |
| 7 or more and less than 11 | 24 |
| 3 or more and less than 7 | 25 |
| 0 or more and less than 3 | 26 |

TABLE 2

| | Voltage section pass time | Normalized count | The number of battery cells in which current interrupt device is opened |
|---|---|---|---|
| 1st battery | 152 | 99 | 0 |
| 2nd battery | 160 | 104 | 0 |
| 3rd battery | 157 | 102 | 0 |
| 4th battery | 151 | 98 | 0 |
| 5th battery | 156 | 101 | 0 |
| 6th battery | 119 | 77 | 5 |
| 7th battery | 156 | 101 | 0 |
| 8th battery | 159 | 103 | 0 |
| 9th battery | 159 | 103 | 0 |
| 10th battery | 160 | 104 | 0 |
| 11th battery | 156 | 101 | 0 |
| 12th battery | 156 | 101 | 0 |
| 13th battery | 154 | 100 | 0 |

The display unit 150 may display a warning message indicating that the current interrupt device is opened when a ratio of the number of battery cells 11 in which the current interrupt device is opened among one or more battery cells 11 included in the battery unit 10 in which the current interrupt device is opened is equal to or more than a predetermined value. The battery user may know a risk situation while viewing the display unit 150 and only when the ratio of the battery cells 11 in which the current interrupt device is opened is higher as the predetermined value is higher, the warning message is displayed, and as a result, the predetermined value may be approximately 40%.

Figure 4:
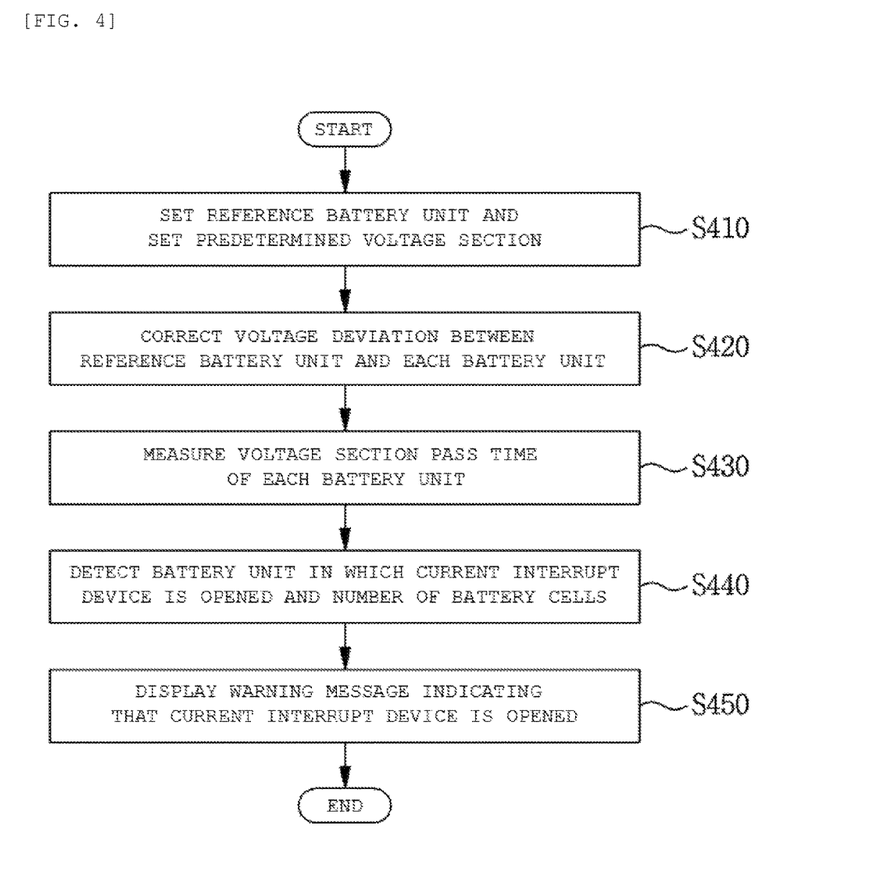
FIG. 4 is a flowchart for schematically describing a method for sensing opening of a current interrupt device of a battery unit according to an embodiment of the present invention.

FIG. 4 is a flowchart for describing a method for sensing opening of a current interrupt device of a battery unit according to an embodiment of the present invention.

Referring to FIG. 4, when the method for sensing opening of a current interrupt device of a battery unit 10 according to the embodiment of the present invention starts, the predetermined voltage section is set based on the reference battery unit 10 and the voltage value of the reference battery unit 10 at the time when the predetermined time is reached (S410). A process of step S410 is a step which may be performed by the setting unit 110 described in FIG. 1 and herein, since a description of the setting unit 110 is adopted, a duplicated description is omitted.

In addition, the voltage deviation between the reference battery unit 10 and each battery unit 10 is added to each battery unit 10 to correct the voltage deviation as the voltage value of the reference battery unit 10 (S420). A process of step (S420) is a step which may be performed by the correcting unit 120 described in FIG. 1 and herein, since the description of the correcting unit 120 is adopted, the duplicated description is omitted.

Then, the voltage section pass time of each battery unit 10 is measured (S430). The voltage section pass time of each battery unit 10 is an element for acquiring the normalized coefficient. The process of step (S430) is a step which may be performed by the measuring unit 130 described in FIG. 1 and herein, since the description of the measuring unit 130 is followed, the duplicated description is omitted.

Then, the battery unit 10 in which the current interrupt device is opened and the number of battery cells 11 included in the battery unit 10 in which the current interrupt device is opened are detected by comparing the normalized coefficient and the predetermined reference value with each other (S440). The process of step S440 is a step which may be performed by the detecting unit 140 described in FIG. 1 and herein, since the description of the detecting unit 140 is followed, the duplicated description is omitted.

In addition, the warning message indicating that the current interrupt device is opened is displayed in order to transfer the risk situation to the battery user (S450). The process of step S450 is a step which may be performed by the display unit 150 described in FIG. 1 and herein, since the description of the display unit 150 is followed, the duplicated description is omitted.

Figure 5:
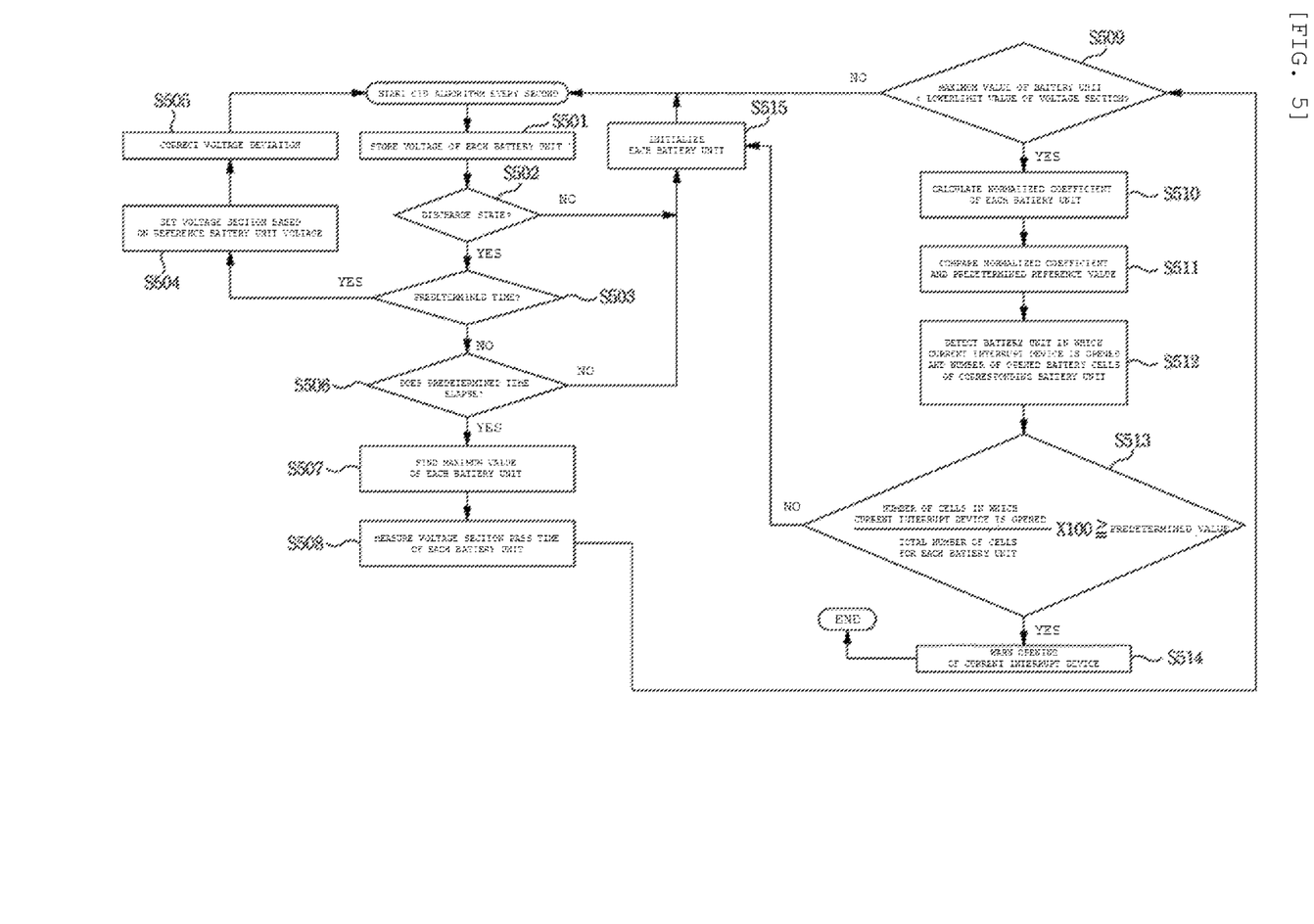
FIG. 5 is a flowchart for specifically describing a method for sensing opening of a current interrupt device of a battery unit according to an embodiment of the present invention.

FIG. 5 is a flowchart for specifically describing a method for sensing opening of a current interrupt device of a battery unit according to an embodiment of the present invention.

Referring to FIG. 5, when the method for sensing opening of a current interrupt device of a battery unit according to the embodiment of the present invention starts, the voltage of each battery unit is stored (S501), it is determined whether each battery unit is discharged (S502), and thereafter, when the predetermined time elapses (S503), the predetermined voltage section is set based on the voltage value of the reference battery unit (S504). The processes of steps S501, S502, S503, and S504 are steps which may be performed by the setting unit 110 described in FIG. 1 and herein, since the description of the setting unit 110 is followed, the duplicated description is omitted.

In addition, the voltage deviation is corrected based on the voltage value of the reference battery unit (S505). The process of step S505 is a step which may be performed by the correcting unit 120 described in FIG. 1 and herein, since the description of the correcting unit 120 is followed, the duplicated description is omitted.

Then, when the predetermined time elapsed (S506), the maximum value among the voltage values of the respective battery units is found (S507), the voltage section pass time of each battery unit is measured (S508), and the maximum value among the voltage values of the respective battery units and the lowerlimit value of a predetermined voltage section are compared with each other (S509), and when the lowerlimit value of the predetermined voltage section is larger than the maximum value among the voltage values of the battery units, the normalized coefficient of each battery unit is calculated (S510). The normalized coefficient and the predetermined reference value are compared with each other (S511) to detect the battery unit in which the current interrupt device is opened and the number of battery cells in which the corresponding battery unit is opened (S512). The processes of step S506, S507, S508, S509, S510, S511, and S512 are steps which may be performed by the detecting unit 140 described in FIG. 1 and herein, since the description of the detecting unit 140 is followed, the duplicated description is omitted.

In addition, when the ratio of the battery cells in which the current interrupt device is opened among the battery cells included in the battery unit in which the current interrupt device is opened is equal to or more than a predetermined value (S513), the warning message indicating that the current interrupt device is opened is displayed (S514). The processes of steps S513 and S514 are steps which may be performed by the display unit 150 described in FIG. 1 and herein, since the description of the display unit 150 is followed, the duplicated description is omitted.

Hereinabove, a specific embodiment of the present invention has been illustrated and described, but the technical spirit of the present invention and the accompanying drawings are not limited to the accompanying drawings and the described contents and it is apparent to those skilled in the art that various modifications of the present invention can be made within the scope without departing from the spirit of the present invention and the modifications are included in the claims of the present invention without departing from the spirit of the present invention.

The invention claimed is:

1. An apparatus for sensing opening of a current interrupt device of a battery unit, comprising:
    a setting unit setting a predetermined voltage section when discharge of one or more battery units starts;
    a measuring unit measuring a voltage section pass time which is the time when the one or more battery units pass through the predetermined voltage section for each battery unit;
    a detecting unit detecting a battery unit in which the current interrupt device (CID) is opened among the one or more battery units based on the voltage section pass time for each battery unit and detecting the number of battery cells in which the CID is opened among one or more battery cells included in the battery unit in which the CID is opened; and
    a correcting unit calculating a difference between the voltage of the reference battery unit when the predetermined time elapses and the voltage of each of the one or more battery units and adding the voltage difference value to the voltage value of each of the one or more battery units.

2. The apparatus of claim 1, wherein the setting unit sets any one of the one or more battery units which are discharged as a reference battery unit when discharge of the one or more battery units starts and sets the predetermined voltage section based on a voltage value of the reference battery unit when a predetermined time elapses after the discharge starts.

3. The apparatus of claim 1, wherein the detecting unit finds a maximum value among the voltage values of the one or more respective battery units and compares the maximum value and a lowerlimit value of the predetermined voltage section.

4. The apparatus of claim 3, wherein the detecting unit calculates a normalized count which is a percentage of the voltage section pass time of the battery unit to an average of the voltage section pass time of all of the one or more battery units for each battery unit when the maximum value is smaller than the lowerlimit value.

5. The apparatus of claim 4, wherein the detecting unit compares the normalized coefficient and a predetermined reference value with each other to detect the battery unit in which the CID is opened among the one or more battery units and the number of battery cells in which the CID is opened among one or more battery cells included in the battery unit in which the CID is opened.

6. The apparatus of claim 5, further comprising: a display unit displaying a warning message indicating that the CID is opened when a ratio of the number of battery cells in which the CID is opened among one or more battery cells included in the battery unit in which the CID is opened is equal to or more than a predetermined value.

7. A method for sensing opening of a current interrupt device of a battery unit, comprising:
setting a predetermined voltage section when discharge of one or more battery units starts;
measuring a voltage section pass time which is the time when the one or more battery units pass through the predetermined voltage section for each battery unit;
detecting a battery unit in which the current interrupt device (CID) is opened among the one or more battery units based on the voltage section pass time for each battery unit and detecting the number of battery cells in which the CID is opened among one or more battery cells included in the battery unit in which the CID is opened; and
calculating a difference between the voltage of the reference battery unit when the predetermined time elapses and the voltage of each of the one or more battery units and adding the voltage difference value to the voltage value of each of the one or more battery units.

8. The method of claim 7, wherein the setting includes setting any one of the one or more battery units which are discharged as a reference battery unit when discharge of the one or more battery units starts and setting the predetermined voltage section based on a voltage value of the reference battery unit when a predetermined time elapses after the discharge starts.

9. The method of claim 7, wherein the detecting includes finding a maximum value among the voltage values of the one or more respective battery units and comparing the maximum value and a lowerlimit value of the predetermined voltage section.

10. The method of claim 9, wherein the detecting further includes calculating a normalized count which is a percentage of the voltage section pass time of the battery unit to an average of the voltage section pass time of all of one or more battery units for each battery unit when the maximum value is smaller than the lowerlimit value.

11. The method of claim 10, wherein the detecting further includes comparing the normalized coefficient and a predetermined reference value with each other to detect the battery unit in which the CID is opened among the one or more battery units and the number of battery cells in which the CID is opened among one or more battery cells included in the battery unit in which the CID is opened.

12. The method of claim 11, further comprising:
displaying a warning message indicating that the CID is opened when a ratio of the number of battery cells in which the CID is opened among one or more battery cells included in the battery unit in which the CID is opened is equal to or more than a predetermined value.

* * * * *